(12) United States Patent
Seward

(10) Patent No.: US 6,671,862 B1
(45) Date of Patent: Dec. 30, 2003

(54) METHOD AND APPARATUS FOR SIMPLIFYING A CIRCUIT MODEL

(75) Inventor: Robert Y. Seward, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/213,960

(22) Filed: Aug. 7, 2002

(51) Int. Cl.[7] ............................................. G06F 17/50
(52) U.S. Cl. ................................. 716/5; 716/6; 716/10
(58) Field of Search ....................... 716/1, 4–6, 10–13, 716/18; 703/14, 19

(56) References Cited

U.S. PATENT DOCUMENTS 5,638,294 A * 6/1997 Sasada ........................... 716/5
5,699,264 A * 12/1997 Nakamura et al. .............. 716/6
5,875,114 A * 2/1999 Kagatani et al. ................ 716/6
6,463,570 B1 * 10/2002 Dunn et al. ..................... 716/5
6,463,574 B1 * 10/2002 Culetu et al. .................. 716/10

OTHER PUBLICATIONS

Shun–Lin Su, Vasant B. Rao, & Timothy N. Trick; A Simple And Accurate Node Reduction Technique For Interconnect Modeling In Circuit Extraction; IEEE International Conference On Computer–Aided Design, ICCAD–86 Digest of Technical Papers; pp. 270–273; Nov. 11–13, 1986.

A.J. van Genderen & N.P. van der Meijs; Extracting Simple But Accurate RC Models For VLSI Interconnection; 1988 IEEE International Symposium On Circuits And Systems; pp. 2351–2354; Jun. 7–9, 1988.

Bernard N. Sheehan; TICER: Realizable Reduction Of Extracted RC Circuits; 1999 IEEE/ACM International Conference On Computer–Aided Design; pp. 200–203; Nov. 7–11, 1999.

Anirudh Devgan & Peter R. O'Brien; Realizable Reduction For RC Interconnect Circuits; 1999 IEEE/ACM International Conference On Computer–Aided Design; pp. 204–207; Nov. 7–11, 1999.

* cited by examiner

*Primary Examiner*—Matthew Smith
*Assistant Examiner*—Paul Dinh

(57) ABSTRACT

A method, apparatus, and computer program product are described for simplifying a circuit model. The circuit model has at least interconnected active device models, resistance models, and capacitance models. The method involves identifying an active device having an input at a first circuit node coupled to a resistance, where the resistance connects to a second circuit node of the circuit. An input capacitance of the active device is computed and a time constant is computed of the resistance and a total capacitance of the circuit node, including the input capacitance of the active device. The time constant is compared to a threshold, and, if the time constant is less than the threshold, the resistance is removed from the circuit model.

20 Claims, 3 Drawing Sheets

METHOD AND APPARATUS FOR SIMPLIFYING A CIRCUIT MODEL

BACKGROUND

Circuit simulation and timing analysis software, hereinafter timing software, is commonly used during design of integrated circuits to determine whether circuitry meets timing requirements. Common timing software includes analog circuit simulators such as Spice, static timing analysis software like HiTas, and programs like Pathmill and Timemill, as well as other programs. Timing software includes dynamic timing software, which models circuit performance, and static timing software, which compares total path delays against limits. Timing software generally works by analyzing or simulating a computer model of circuitry of an integrated circuit, hereinafter the circuit model.

It is known that timing software produces results that are highly dependent upon the accuracy of the circuit model. It is also known that the execution time and memory requirements of timing software is highly dependent upon the complexity of the circuit model, with complex circuit models requiring much greater execution time for analysis than simple circuit models.

Every real integrated circuit has parasitic resistances and capacitances. These are resistances and capacitances that exist in the circuit not because they are desired circuit elements, but because on-chip wiring and diffused regions have resistance and capacitance. It is well known in the art that timing software requires circuit models incorporating the effect of parasitic resistance and capacitance if accurate results are to be produced. In particular, it is known that parasitic resistance and capacitance of on-chip wiring, or interconnect, is particularly significant in modem, high speed, submicron, integrated circuits. The term interconnect as used herein includes all on-chip signal wiring, including diffused regions and polysilicon, whether silicided or not, and metal lines.

Circuit extraction software, available from vendors including Cadence and Mentor Graphics, is commonly run on integrated circuit designs to extract parasitic resistances and capacitances. Software for extraction includes Diva, Dracula, Hyperextract, xCalibre, and other programs. These resistances and capacitances are then incorporated into circuit models for use with timing software. It is known that these circuit models can become extremely complex during analysis of designs for high performance submicron integrated circuits.

It is desirable to simplify complex circuit models, such as may be produced by circuit extraction software, so that timing software will run in reasonable time and memory. It is particularly desirable to simplify circuit models for dynamic timing, since dynamic timing run times are often exponential with respect to model complexity.

It is known that some extracted resistances and capacitances have much greater impact on timing software results than others.

A typical extracted circuit model includes models of many active elements. Typical active elements may include CMOS transistors as P and N channel transistors, each of which has gate capacitance. Circuit models may also include other types of transistor-level active elements, such as bipolar transistors, silicon-germanium bipolar transistors, as well as gallium arsenide bipolar and MESFET devices. An extracted circuit model may also include active elements such as higher-level logic elements, or logic gates. These higher level models may also include modeled input capacitance. Circuit models also may include many resistors for modeling interconnect resistance, and many capacitors for modeling interconnect capacitance.

A prior technique for simplification of complex circuit models is to remove all resistances from the model that have values below a preset minimum resistance threshold. Similarly, all capacitances below a preset minimum capacitance threshold may also be deleted. Most extraction software is capable of ignoring resistance and capacitance below threshold values. While this is simple to implement and can greatly simplify a circuit model, the simplification may introduce significant error into timing software results.

Some of this error results because the impact of a particular resistance or capacitance depends on other model elements and circuit topology. For example, even a small capacitance can cause significant timing delay if it is driven through lengthy interconnect having large resistance. If the small capacitance is deleted from the model, that delay will be ignored.

Several techniques for simplification of circuit models have been published. Such methods are reported by A. J. van Genderen, et al, Extracting Simple but Accurate RC Models for VLSI Interconnect, IEEE International Symposium on Circuits and Systems, 1988; A. Devgan et. al. Realizable Reduction for RC Interconnect Circuits, IEEE/ACM International Conference on CAD, November 1999; B. Sheehan, TICER: Realizable Reduction of Extracted RC Circuits, 1999 IEEE/ACM International Conference on CAD, November 1999; and S Su, et. al, A Simple and Accurate Node Reduction Technique for Interconnect Modeling in Circuit Extraction, IEEE International Conference on CAD, November 1986.

Sheehan, incorporated herein by reference, computes nodal time constants for nodes of the circuit, classifying these time constants into slow, normal, and quick classifications. Nodes having time constants substantially faster than the frequency range of interest are classified as quick nodes; while those having time constants substantially slower than the frequency range of interest are classified as slow nodes. Quick and slow nodes are then eliminated from the circuit.

In particular Sheehan finds instances of quick nodes internal to, and coupled to, normal nodes in an RC network. Sheehan then removes the internal quick node of each instance by effectively transferring nodal capacitance, conductance, and other circuit elements from the quick node to the normal node. Sheehan thereby constructs a simplified network having normal simulation elements such as resistors and capacitors.

Most existing RC network simplification methods focus on reduction at internal nodes of a RC network. These algorithms typically avoid alteration or simplification at terminal nodes of the RC network, such as those attached to device inputs.

It is known that simulation models of CMOS and other field-effect transistors include models of significant input capacitance. This capacitance is nonlinear with voltage and represents a combination of parasitic capacitances and gate capacitance. Each transistor may have a gate resistance associated with it.

SUMMARY

A circuit model includes a network of resistors, capacitors, and active elements. The circuit model may incorporate parasitic resistances and capacitances as extracted from an integrated circuit layout. Typically, each input of an active element of the circuit model is associated with a branch resistance; branch resistances may include a portion of resistance of a gate of each MOS transistor. Each active element is associated with an input capacitance.

Each input to each active element is inspected. In a CMOS, BICMOS, or SIGE integrated circuit, these inputs to active elements include gate connections of N and P type MOS transistors. They may also include base connections of bipolar and heterojunction transistors. Should the circuit model at that point be a capacitance (including an input capacitance of the active element and may include parasitic capacitance), driven through a branch resistance, a time constant for the capacitance and branch resistance is calculated.

If the time constant of the branch resistance and the capacitance is less than a predetermined threshold, the resistance is removed from the circuit without altering other resistances of the circuit model.

DETAILED DESCRIPTION OF THE EMBODIMENTS

Figure 1:
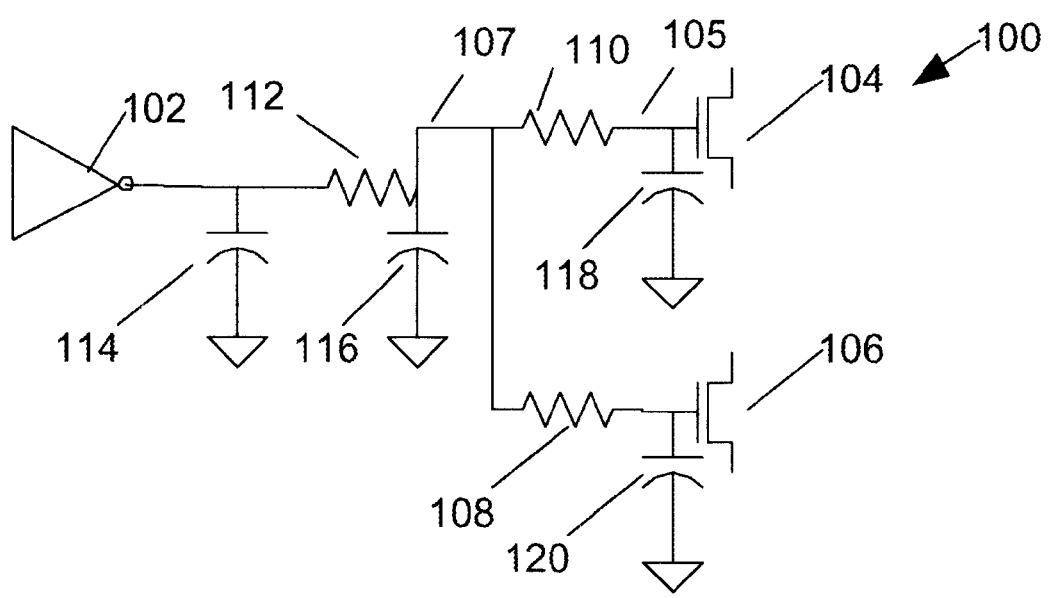
FIG. 1 is a schematic diagram illustrating a portion of a circuit model of an integrated circuit.

In a schematic diagram illustrating a portion 100 (FIG. 1) of a circuit model of an integrated circuit, a driving gate 102 is coupled through on-chip interconnect to one or more device 104, 106 inputs. In a real circuit, there are often both N and P type devices, the present method is applicable to either. Interconnect is inherently resistive, its connectivity and resistance is modeled by resistors 108, 110, 112. Interconnect also has capacitance to one or more nodes, which may be modeled by capacitors 114, 116. There is also input capacitance 118, 120 associated with each device 104, 106.

A digital computer reads the circuit model, which is typically in the form of a netlist. A method 200 (FIG. 2) of reducing the circuit model operates by examining the model at each active device, including devices 104 and 106 (FIG. 1). The method continues by identifying 201 each active device of the circuit model. Each input to each active device, such as the gate terminal of transistor 104, is examined 202 to determine whether the circuit model topology is suited for reduction. If 204 an unsuitable topology is found, no reduction is performed.

Suitable topology for reduction includes multiple devices in parallel so long as the multiple devices are driven through a common resistor.

In a particular embodiment, circuit topology is found to not be suitable for reduction if the input is directly connected to an output terminal of an active device.

If the model topology is amenable to reduction, a time constant at that input is computed 206. Generally, this time constant is approximated by multiplying the total capacitance at the input by resistance present at that point in the circuit. The total capacitance used is the sum of any parasitic capacitances 118, input capacitance of the active device 104, and input capacitances of any other active devices present and directly connected to the same node, such as node 105.

It is known that the effective input capacitance of an active device, including CMOS transistors, is a nonlinear function of gate-source voltage. In MOS transistors this nonlinearity is, in part, a consequence of channel formation as gate voltage rises past the device threshold voltage. The input capacitance used in computation of the time constant is the maximum capacitance expected at the input over a particular voltage range of interest. In an alternative embodiment, the input capacitance used in computation of the time constant is an average capacitance over the voltage range (typically from the negative to positive power supply rails) of interest. In a particular embodiment, an average capacitance is estimated by calculating input capacitance Cin=AW+B W L+C L, where A, B, and C are process and voltage range dependent constants, W is device width, and L is device length. The invention is also useful with other methods of calculating input capacitance.

Next, the derived time constant is compared 208 against a threshold value. Inputs having time constants greater than the threshold are not reduced; those having time constants below the threshold are reduced. The threshold value is chosen to permit significant circuit model reduction while minimizing resulting simulation inaccuracy. The threshold depends on the target process for the integrated circuit, and is chosen to be small relative to circuit delays of the circuit. In a particular embodiment, the threshold is chosen to be a small percentage of loaded gate delay, with interconnect delay, of a typical gate having typical local interconnect as determined by circuit simulations.

Figure 3:
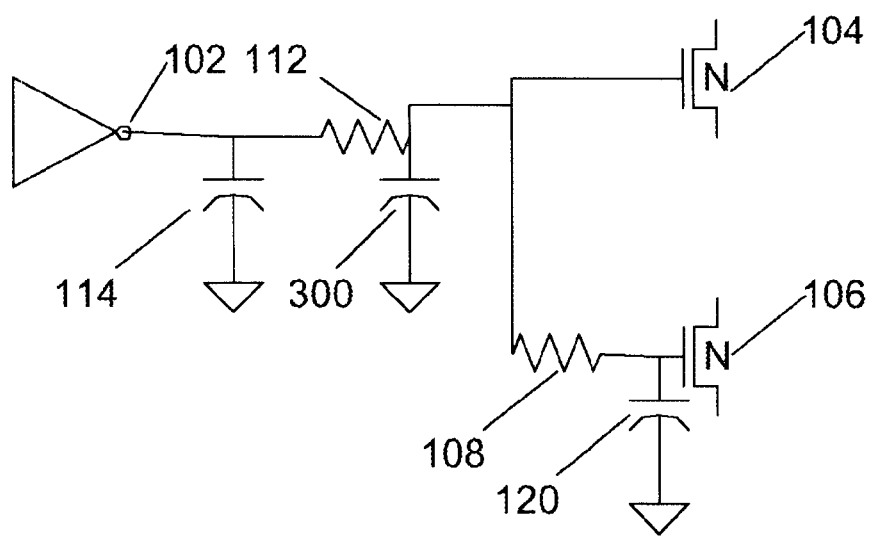
FIG. 3, a schematic diagram of a reduced circuit model.

If the computed time constant is below the threshold; the resistance, such as resistance 110, present at the input is removed from the circuit model, and parasitic capacitances, such as capacitors 116 and 118, formerly connecting to nodes 105 and 107 on each side of resistor 110, are merged into fewer, larger, capacitors, such as capacitor 300 (FIG. 3). In particular, capacitor pairs that couple the nodes to the same node are merged. This results in capacitors to ground or substrate, such as capacitors 116 and 118, being merged into larger capacitor 300. In a particular embodiment, capacitors that couple to different nodes are retained, so as to allow simulation of crosstalk effects.

In a particular embodiment, if a resistor is removed from the circuit model, the circuit model at that input is re-examined 214 to determine if it has suitable topology for further reduction. Suitable topology could result upon removal of a last final input resistor, such as resistors 108 and 110, from a node. If the topology is suited to further reduction, the steps of computing the time constant, comparing the time constant to a threshold, and, if the time constant is below the threshold then removing the resistor and merging capacitors, are repeated. In this way, the digital computer can test resistor 112 for significance and, if it results in an insignificantly small time constant, delete it from the circuit model.

In alternative embodiment, re-examination 214 of the circuit model at the reduced input occurs only if the time constant was below a second threshold, the second threshold being less than the threshold previously compared 208.

Once all reductions possible at a particular active device input have been performed, the method is repeated 218 for any other active device inputs remaining in the circuit model.

Figure 2:
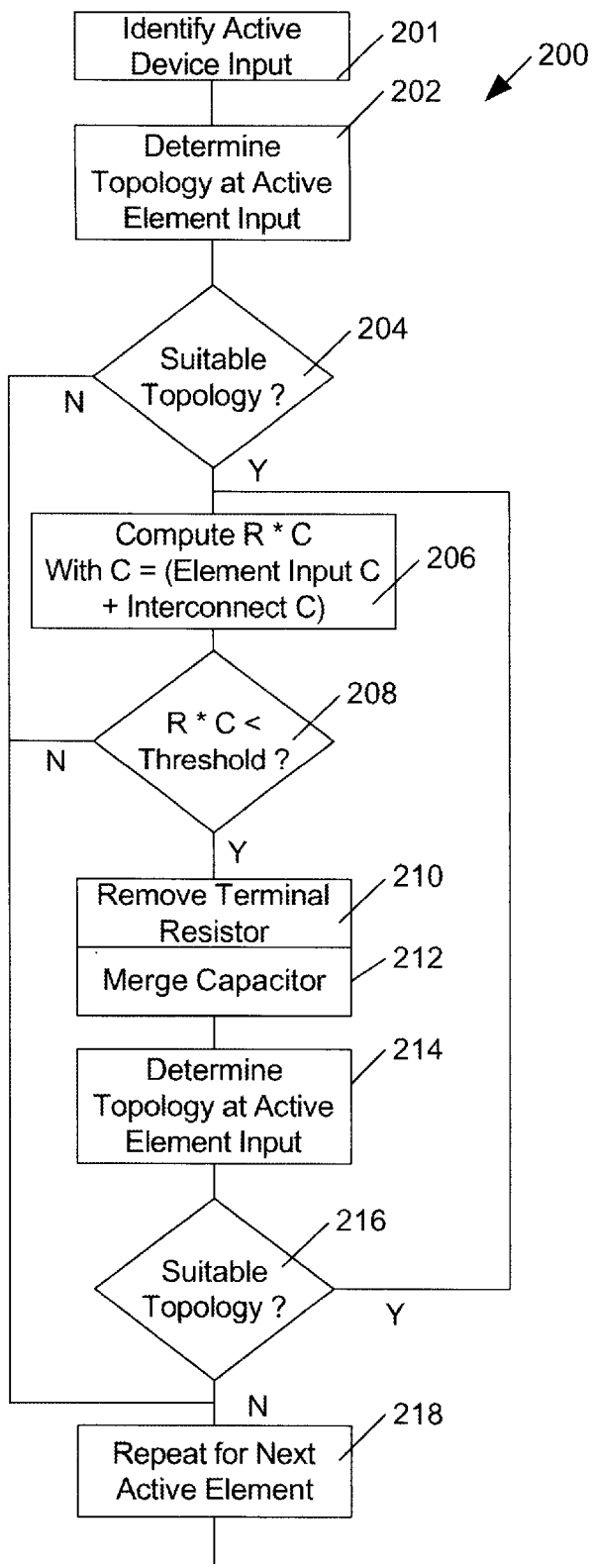
FIG. 2, a flowchart of a circuit model reduction process.

In an alternative embodiment, the method of simplifying a circuit model described herein with reference to FIG. 2 is combined with a method of simplifying internal nodes of RC networks to produce a further simplified circuit model. In a particular alternative embodiment, the method of Sheehan is performed on the circuit model first, the method described herein second, to produce the further simplified circuit model.

A computer program product is any machine-readable media, such as an EPROM, ROM, RAM, DRAM, disk memory, or tape, having recorded on it computer readable code that, when read by and executed on a computer, instructs that computer to perform a particular function or sequence of functions. A computer having the code loaded on it includes a computer program product because it incorporates DRAM and/or disk memory having the code recorded in it. A computer executing the circuit model reduction method of the present invention would generally also incorporate a program product since code for the method would typically reside in memory of the computer while the method is being performed.

Figure 4:
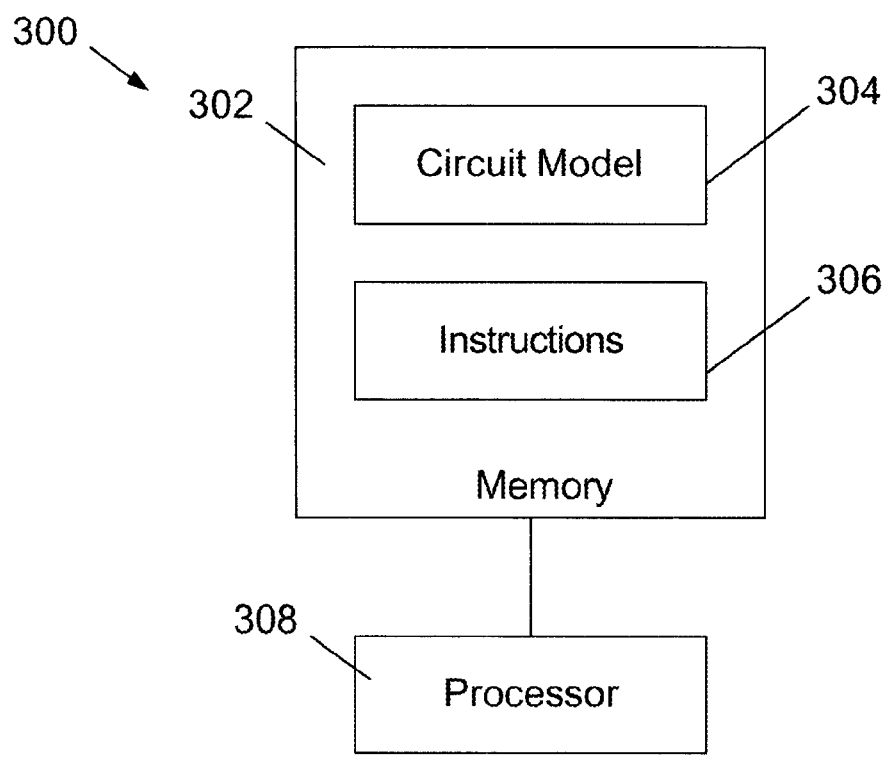
FIG. 4, a block diagram of apparatus for performing the method herein described.

An apparatus 300 (FIG. 4) for performing the method has a memory system 302, which incorporates one or more levels of main memory, cache, and disk memory subsystems. The memory system 302 has recorded therein a circuit model 304 and a sequence of machine-readable instructions 306 for instructing a processor 308 to perform the steps of the method of FIG. 2 upon the circuit model 304 as heretofore described. In a particular embodiment, memory system 302 is memory of a digital computer, and processor 308 is a processor of the digital computer.

What is claimed is:

1. A method of simplifying a circuit model, the circuit model comprising a plurality of interconnected active device models, resistance models, and capacitance models, the method comprising the steps of:
   identifying an active device having an input coupled to a first circuit node coupled to a resistance, where the resistance model is coupled to a second circuit node of the circuit model;
   calculating an input capacitance of the active device;
   computing a time constant of the resistance and a total capacitance of the first circuit node, where the total capacitance of the first circuit node includes the input capacitance of the active device;
   comparing the time constant to a threshold; and
   if the time constant is less than the threshold, removing the resistance from the circuit model and coupling the input of the active device to the second circuit node.

2. The method of claim 1, wherein the method is repeated for a plurality of active devices of the circuit model.

3. The method of claim 1, wherein the method is repeated at an input of the active device if the time constant was less than the threshold and, after removing the resistor from the circuit model and coupling the input of the active device to the second circuit node, a topology of the circuit model at the input of the active device is suitable for simplification.

4. The method of claim 3, wherein the method is repeated for a plurality of active devices of the circuit model.

5. The method of claim 3, further comprising the step of simplifying internal nodes of the circuit model.

6. The method of claim 5, wherein the step of simplifying internal nodes of the circuit model is performed prior to the step of identifying an active device having an input coupled to a first circuit node.

7. The method of claim 1, further comprising the step of simplifying internal nodes of the circuit model.

8. The method of claim 7, wherein the step of simplifying internal nodes of the circuit model is performed prior to the step of identifying an active device having an input coupled to a first circuit node.

9. The method of claim 8, wherein the step of simplifying internal nodes of the circuit model is performed according to the method of Sheehan.

10. A computer program product comprising a machine readable media having recorded thereon machine readable instructions comprising instructions for execution of the steps:
    identifying an active device having an input coupled to a first circuit node coupled to a resistance, where the resistance model is coupled to a second circuit node of the circuit model;
    calculating an input capacitance of the active device;
    computing a time constant of the resistance and a total capacitance of the circuit node, where the total capacitance of the circuit node includes the input capacitance of the active device;
    comparing the time constant to a first threshold; and
    if the time constant is less than the threshold, removing the resistance from the circuit model and coupling the input of the active device to the second circuit node.

11. The computer program product of claim 10, wherein the instructions further comprise instructions for iterating the steps of identifying, calculating, computing, comparing, and removing for a plurality of active devices of the circuit model.

12. The computer program product of claim 10, wherein the instructions further comprise instructions for iterating at an input of the active device if the time constant was less than a second threshold and, after removing the resistor from the circuit model and coupling the input of the active device to the second circuit node, a topology of the circuit model at the input of the active device is suitable for simplification.

13. The computer program product of claim 12, wherein the instructions further comprise instructions for iterating the steps of identifying, calculating, computing, comparing, and removing, for a plurality of active devices of the circuit model.

14. The computer program product of claim 12, further comprising machine readable code for simplifying internal nodes of the circuit model.

15. The computer program product of claim 14, wherein the second threshold is equal to the first threshold.

16. The computer program product of claim 15, wherein the second threshold is less than the first threshold.

17. The computer program product of claim 10, further comprising machine readable instructions for simplifying internal nodes of the circuit model.

18. The computer program product of claim 17, wherein simplifying internal nodes of the circuit model is performed prior to identifying an active device having an input coupled to a first circuit node.

19. Apparatus for simplifying a circuit model, the circuit model comprising a plurality of interconnected active device models, resistance models, and capacitance models, comprising:
    means for identifying an active device model having an input coupled to a first circuit node coupled to a resistance model, where the resistance model is coupled to a second circuit node of the circuit model;
    means for calculating an input capacitance of the active device model;
    means for computing a time constant of the resistance model and a total capacitance of the circuit node, where the total capacitance of the circuit node includes the input capacitance of the active device model;
    means for comparing the time constant to a threshold; and
    if the time constant is less than the threshold, removing the resistance model from the circuit model and altering the circuit model to couple the input of the active device model to the second circuit node.

20. Apparatus for simplifying a circuit model comprising digital computing apparatus having memory, the memory having recorded therein machine-readable instructions for performing steps comprising:

reading a circuit model comprising a plurality of interconnected active device models, resistance models, and capacitance models, identifying an active device model of the circuit model having an input coupled to a first circuit node coupled to a resistance model, where the resistance model is coupled to a second circuit node of the circuit model;

calculating an input capacitance of the active device;

computing a time constant of the first circuit node from a resistance of the resistance model and a total capacitance of the first circuit node, where the total capacitance of the first circuit node includes the input capacitance of the active device;

comparing the time constant to a threshold, and, if the time constant is less than the threshold, removing the resistance from the circuit model and coupling the input of the active device to the second circuit node; and repeating the steps of identifying, calculating, computing, and comparing for a plurality of active devices of the circuit model.

* * * * *